(12) United States Patent
Liu

(10) Patent No.: US 7,914,184 B2
(45) Date of Patent: Mar. 29, 2011

(54) LED ILLUMINATING DEVICE AND LIGHT ENGINE THEREOF

(75) Inventor: Tay-Jian Liu, Taipei Hsien (TW)

(73) Assignee: Foxconn Technology Co., Ltd., Tucheng, Taipei County (TW)

( * ) Notice: Subject to any disclaimer, the term of this patent is extended or adjusted under 35 U.S.C. 154(b) by 197 days.

(21) Appl. No.: 12/406,079

(22) Filed: Mar. 17, 2009

(65) Prior Publication Data
US 2009/0256459 A1 Oct. 15, 2009

(30) Foreign Application Priority Data
Apr. 11, 2008 (CN) .......................... 2008 1 0066578

(51) Int. Cl.
*F21V 29/00* (2006.01)
*F21L 4/00* (2006.01)

(52) U.S. Cl. .................. 362/373; 362/294; 362/157
(58) Field of Classification Search .................. 362/373, 362/294, 345, 547, 580, 157, 208
See application file for complete search history.

(56) References Cited

U.S. PATENT DOCUMENTS

| | | | | |
|---|---|---|---|---|
| 6,301,779 B1 * | 10/2001 | Azar | ........................... | 29/890.03 |
| 7,438,448 B2 * | 10/2008 | Chen | ............................ | 362/373 |
| 7,494,249 B2 * | 2/2009 | Li | ................................. | 362/294 |
| 7,607,802 B2 * | 10/2009 | Kang et al. | ..................... | 362/294 |
| 2007/0253202 A1 * | 11/2007 | Wu et al. | ....................... | 362/294 |
| 2009/0116242 A1 * | 5/2009 | Chen | ............................ | 362/294 |

FOREIGN PATENT DOCUMENTS

| | | |
|---|---|---|
| CN | 2881340 Y | 3/2007 |
| CN | 200982536 Y | 11/2007 |
| CN | 201021880 Y | 2/2008 |
| JP | 2001028417 A * | 1/2001 |

* cited by examiner

*Primary Examiner* — Jong-Suk (James) Lee
*Assistant Examiner* — David R Crowe
(74) *Attorney, Agent, or Firm* — Frank R. Niranjan

(57) ABSTRACT

An LED illuminating device includes an optical section, an electrical section, and a heat dissipation section therebetween. The optical section includes a light source. The electrical section electrically connects with the light source. The heat dissipation section includes a mounting seat, a heat pipe and a heat sink. The heat pipe includes an evaporation section fixed on the mounting seat and thermally connecting with the light source and a condenser section. The heat sink includes a plurality of umbrella-shaped fins each including a main body perpendicular to the condenser section of the heat pipe and two flanges angling downward from two opposite edges of the main body towards the light source. A plurality of air venting holes are defined in the main body and the flanges of each fin.

15 Claims, 9 Drawing Sheets

LED ILLUMINATING DEVICE AND LIGHT ENGINE THEREOF

BACKGROUND

1. Technical Field

Embodiments of the present disclosure generally relate to light emitting diode (LED) illuminating devices, and particularly to an LED illuminating device and a light engine thereof with high heat dissipating efficiency.

2. Description of Related Art

Presently, LEDs (light emitting diodes) are preferred for use in illuminating devices rather than CCFLs (cold cathode fluorescent lamps) due to high brightness, long lifespan, and wide color range.

For an LED, 80-90% of the power consumed by the LED is converted into thermal energy, with only 10-20% of the power consumed converted to light. In addition, a plurality of LEDs must be packaged in a single LED illuminating device to obtain desired brightness.

Thus, heat dissipation is necessary to maintain brightness, lifespan, and reliability of the LED illuminating device.

DETAILED DESCRIPTION OF THE EMBODIMENTS

Figure 1:
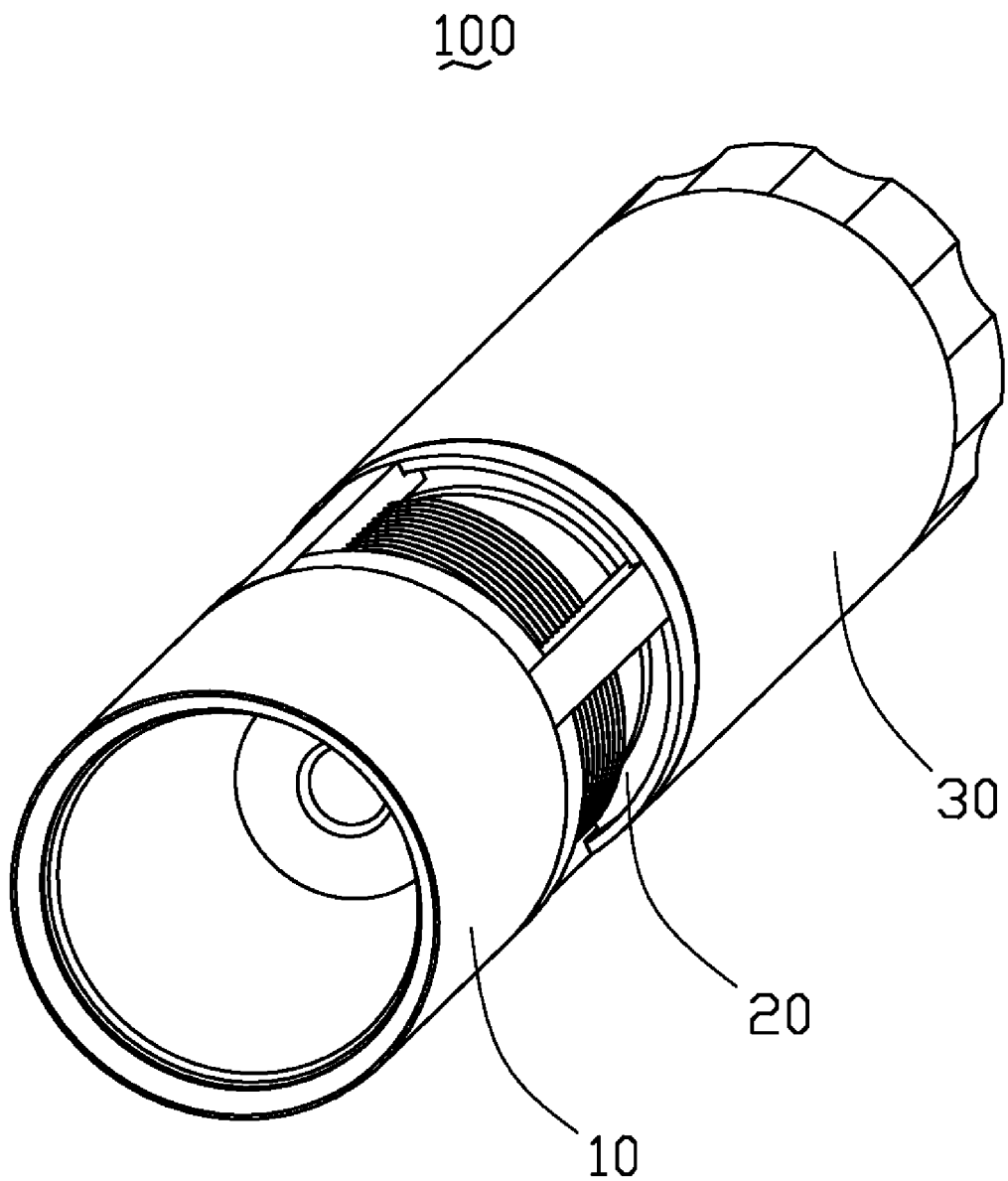
FIG. 1 is an assembled, isometric view of an LED illuminating device in accordance with a first embodiment.

Reference will now be made to the drawing figures to describe the various embodiments in detail.

Referring to FIG. 1, an LED illuminating device 100 in accordance with a first embodiment of the disclosure is shown. The LED illuminating device 100 includes an optical section 10, an electrical section 30, and a heat dissipation section 20 arranged therebetween. The LED illuminating device 100 is substantially cylindrical. The optical section 10 is disposed at a bottom end of the LED illuminating device 100 and electrical section 30 is disposed at a top end of the LED illuminating device 100.

Figure 2:
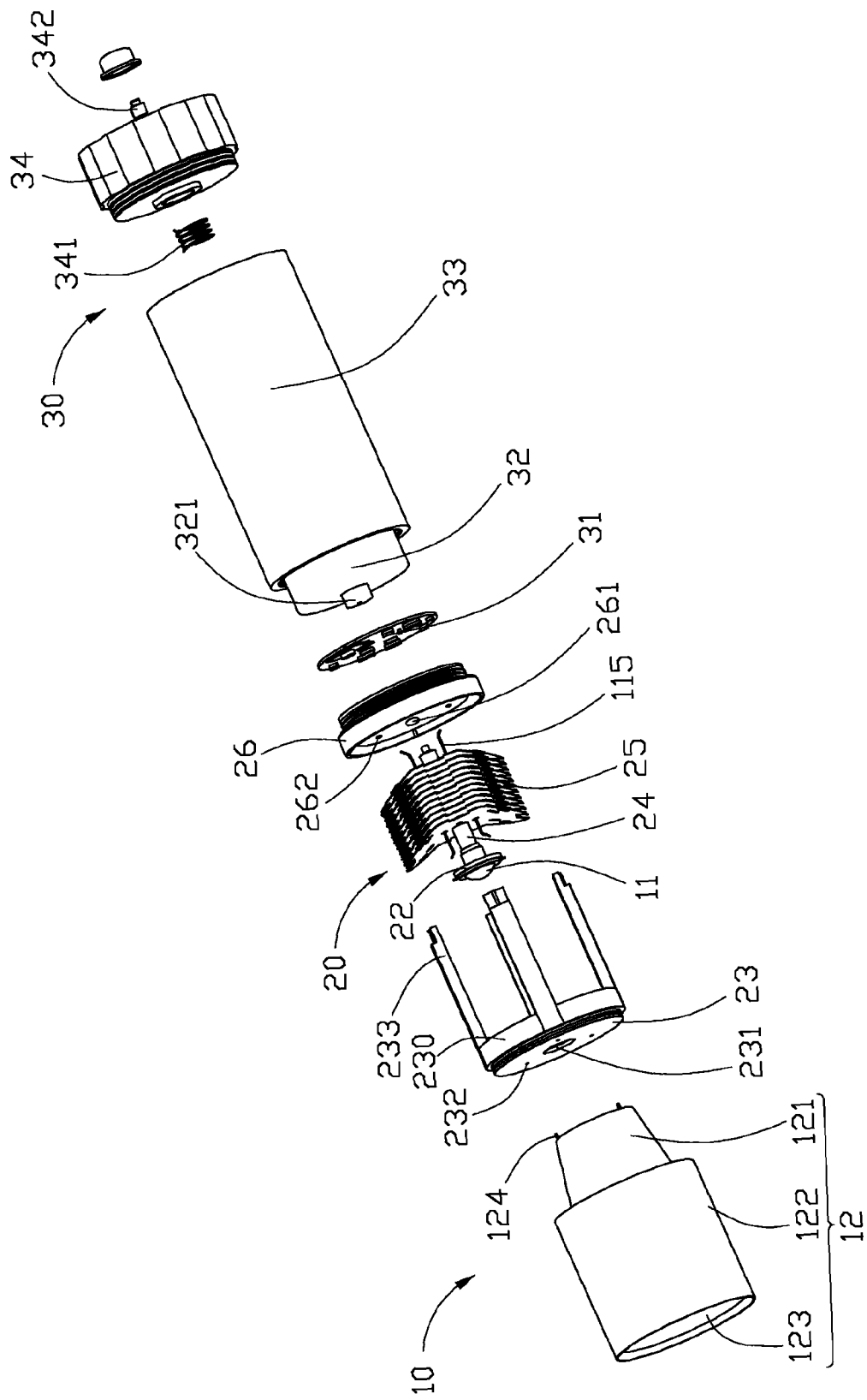
FIG. 2 is an exploded view of the LED illuminating device of FIG. 1.
Figure 3:
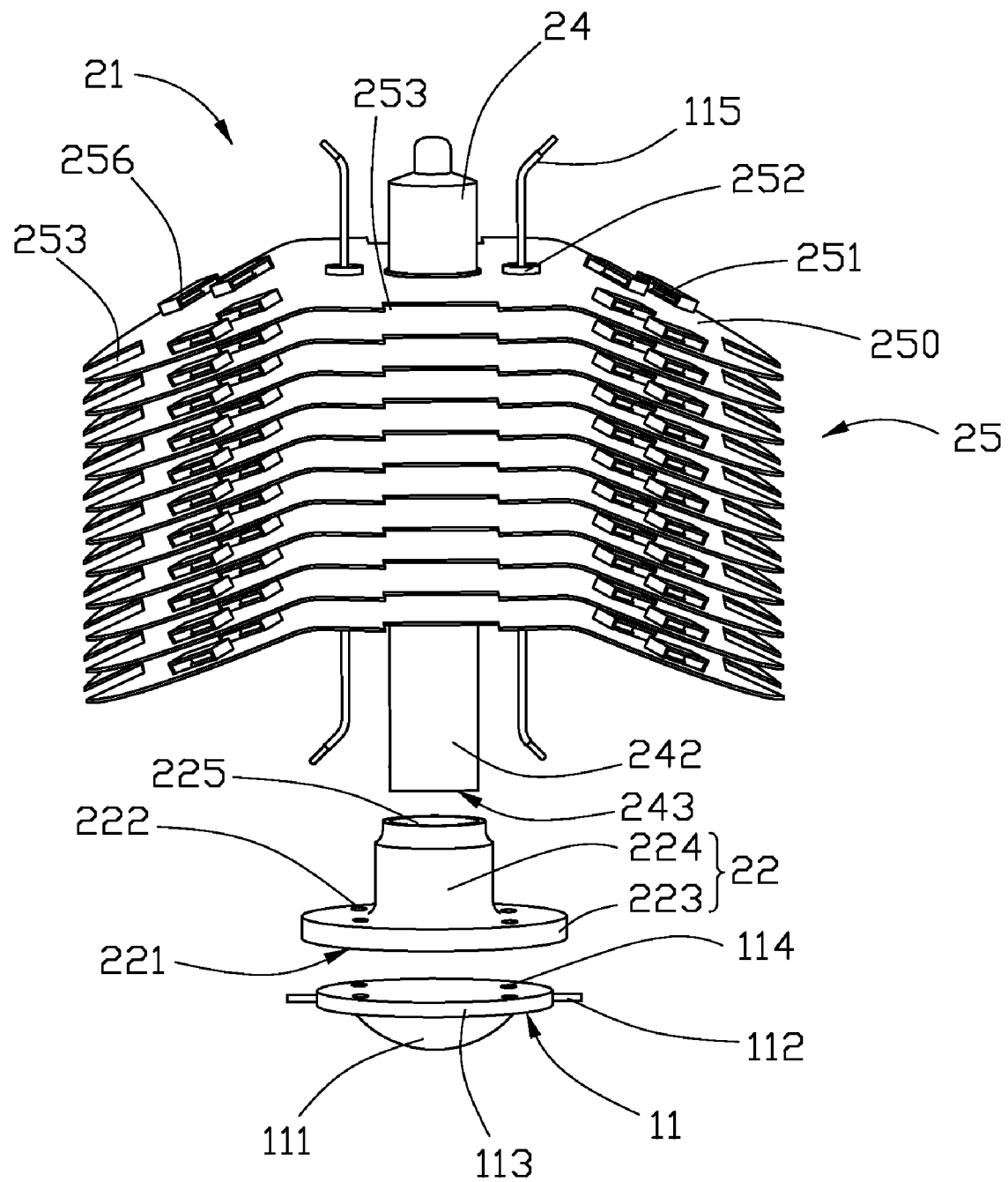
FIG. 3 is an exploded view of a light engine of the LED illuminating device of FIG. 2.

Referring to FIGS. 2 and 3, the optical section 10 includes a light source 11 and a light output housing 12 around the light source 11. Referring to FIG. 3, the light source 11 includes a substrate 113, an emitter 111 electrically connected with the substrate 113, and a pair of electrodes 112 at opposite sides of the substrate 113. A pair of electric wires 115 respectively connects the electrodes 112 with the emitter 111 and the electrical section 30. A plurality of threaded holes 114 are defined in the substrate 113.

Referring to FIG. 2, the light output housing 12 includes a light reflector 121, a housing 122, and an optical lens 123. A top end of the light reflector 121 is coupled to the heat dissipation section 20, a bottom end of the light reflector 121 connects with a top end of the housing 122, and a bottom end of the housing 122 is provided with the optical lens 123. The light reflector 121 is conical and tapers from the bottom end towards the top end. The light reflector 121 defines an opening (not shown) in a central portion of the top end receiving the emitter 111 therein. A plurality of fixing pins 124 extend backward from a periphery of the top end of the light reflector 121 towards the heat dissipation section 20. The light reflector 121 has a reflective inner surface to redirect light from the emitter 111 towards the optical lens 123. The light reflector 121 and the optical lens 123 provides characteristics to the light source 11, for example, directionality.

The heat dissipation section 20 includes a mounting seat 22, a heat sink 25, a straight heat pipe 24 thermally connecting the mounting seat 22 with the heat sink 25, a frame 23 supporting the heat sink 25, and a holder 26 mechanically connecting the heat dissipation section 20 with the electrical section 30. The light source 11, the mounting seat 22, the heat sink 25 and the heat pipe 24 cooperatively form a light engine 21 of the LED illuminating device 100.

Figure 4:
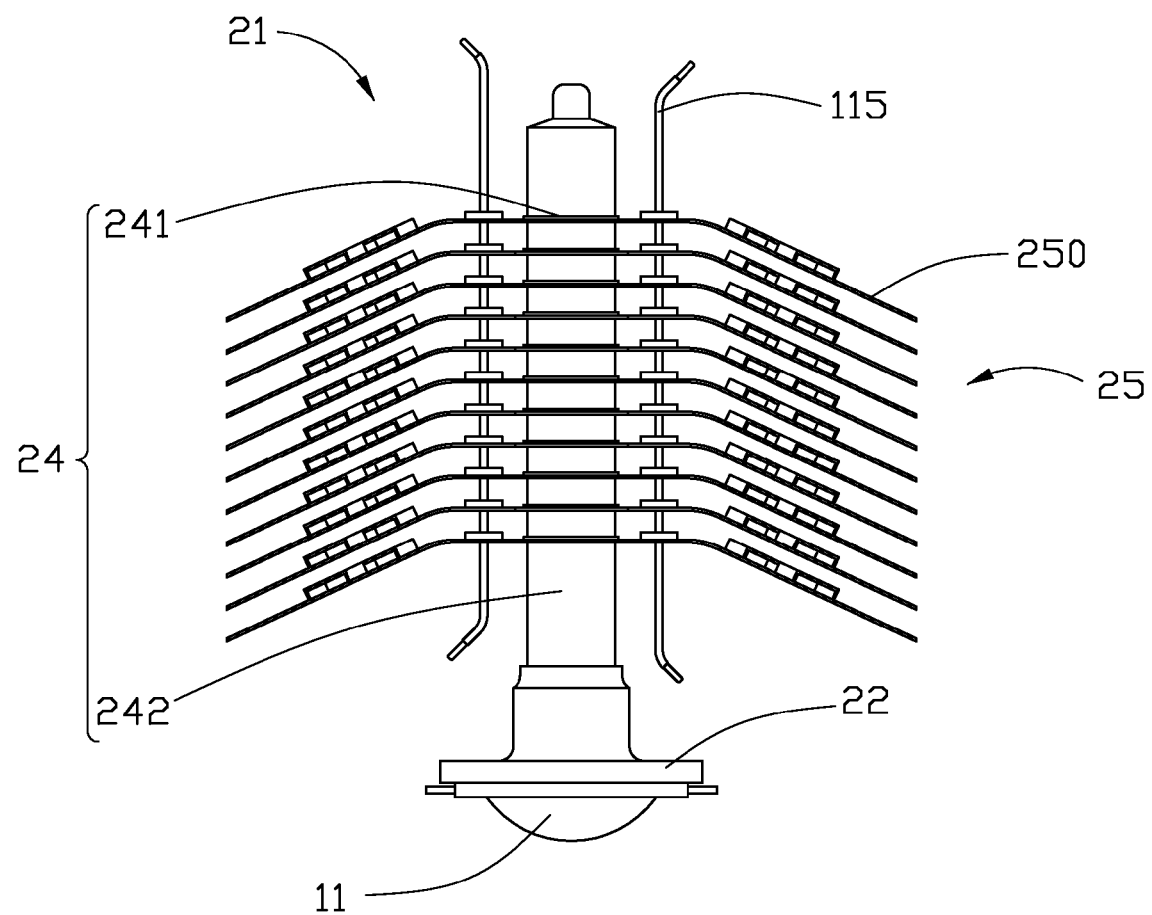
FIG. 4 is a front view of the light engine of FIG. 3.

Referring to FIG. 3 and FIG. 4, the heat pipe 24 is columnar and includes an evaporation section 242 and a condenser section 241 formed at bottom and top ends thereof, respectively. The heat pipe 24 extends in a bottom-to-top axis of the heat sink 25. The evaporation section 242 has a planar bottom surface 243 thermally attaching to the mounting seat 22. The mounting seat 22 includes a plated bottom wall 223 and an annular sidewall 224 extending upwardly from a central portion of the bottom wall 223. A straight central hole 225 is defined in the sidewall 224 receiving the evaporation section 242 of the heat pipe 24 therein. The bottom wall 223 is slightly larger than the substrate 113 of the light source 11. A plurality of threaded holes 222 corresponding to the threaded holes 114 of the substrate 113 is defined in the bottom wall 223 of the mounting seat 22. Fasteners extend through the threaded holes 114, 222 to mount the light source 11 on a bottom surface 221 of the mounting seat 22. The evaporation section 242 of the heat pipe 24 is received in the central hole 225 of the mounting seat 22 with the bottom surface 243 connected with the bottom wall 223; thus, the light source 11 is thermally attached to the evaporation section 242 of the heat pipe 24 via the substrate 113 and the bottom wall 223.

Alternatively, electrical circuits may be directly formed on the bottom surface 221 of the mounting seat 22, with the emitter 111 directly attached thereto, the electric wires 115 connecting to the bottom surface 221 to connect the emitter 111 to the electrical section 30, and whereby the substrate 113 can be omitted while heat resistance between the light source 11 and the electrical section 30 is reduced.

Figure 5:
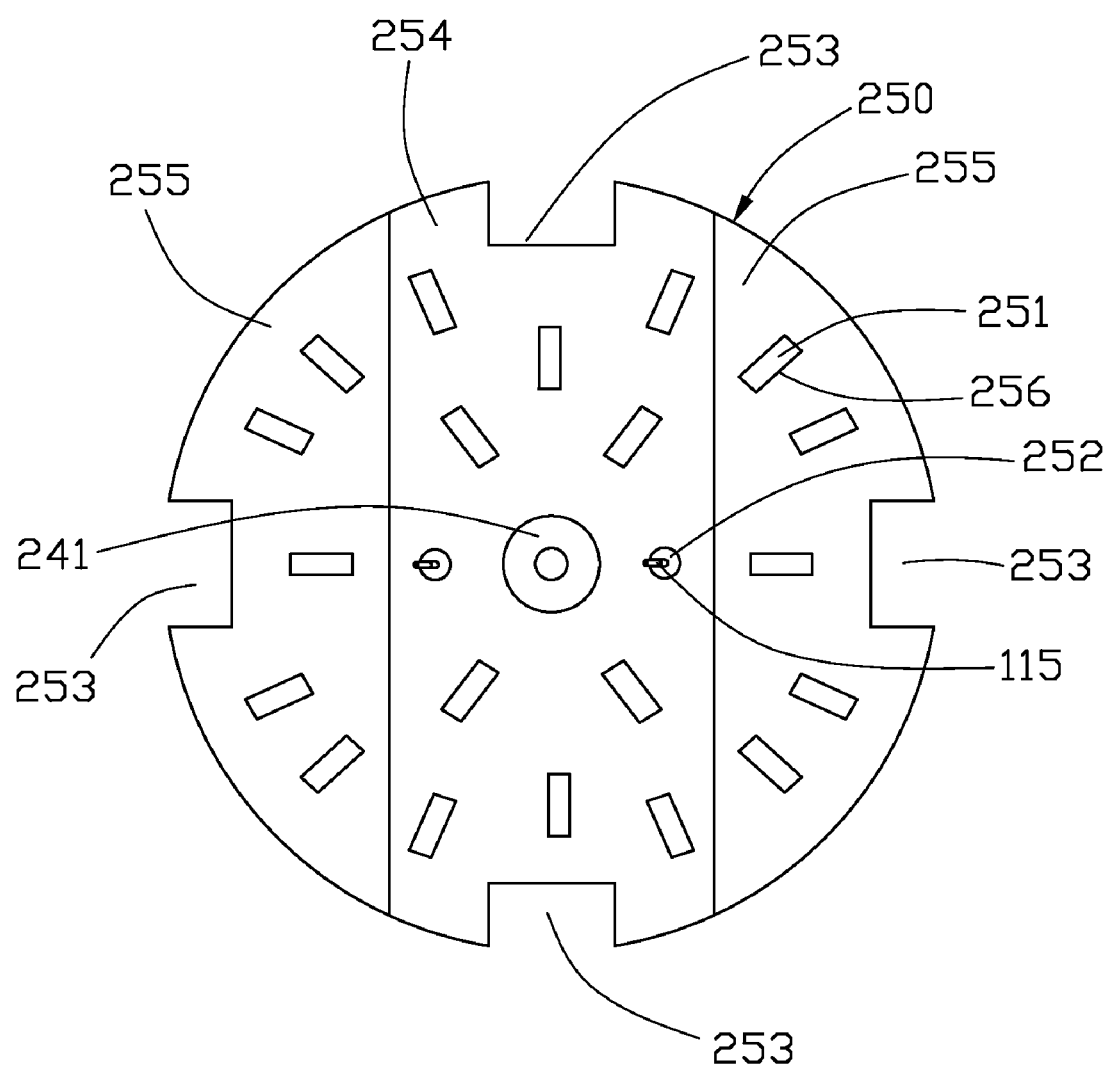
FIG. 5 is a top plan view of the light engine of FIG. 3.

The heat sink 25 includes a plurality of umbrella-shaped fins 250 arranged along an extension axis of the heat pipe 24. Referring to FIG. 5, each of the fins 250 includes a plated main body 254 perpendicular to the heat pipe 24 and two flanges 255 angling downward from two opposite edges of the main body 254 towards the light source 11. The main body 254 defines a central hole (not labeled) receiving the condenser section 241 of the heat pipe 24 therein, and two through holes 252 located on two opposite sides of the central hole receiving the two electric wires 115 therein, respectively, such that the electric wires 115 extend through the heat sink 25 and electrically connect the light source 11 with the electrical section 30. Each of the flanges 255 includes a plurality of protruding members 256 extending upwardly perpendicular to a top surface of each of the flanges 255 towards the electrical section 30. Each of the protruding members 256 defines an air venting hole 251 therein. Each of the air venting holes 251 communicates with opposite sides of a corresponding fin 250 which defines the air venting hole 251. The protruding members 256 enable cool air to produce turbulence between each two neighboring fins 250. The heat sink 25 further defines a plurality of latching grooves 253 at an outer circumferential surface thereof. Each latching groove 253 extends through the heat sink 25 along a lateral axis of the heat sink 25.

Referring back to FIG. 2, the frame 23 includes a base 230 and a plurality of arms 233 extending backward from a periphery of the base 230. The base 230 defines an aperture 231 in a centre and a plurality of fixing holes 232 around the aperture 231. The aperture 231 of the base 23 aligns with and has the same diameter as the opening of the light reflector 121. The emitter 111 extends through the aperture 231 and the opening into the reflector 121 of the optical section 10. The fixing pins 124 of the light reflector 121 are received in the fixing holes 232, respectively, mounting the optical section 10 on the frame 23. The arms 233 are received in the latching grooves 253 of the heat sink 25, respectively. A mounting hole 261 is defined in a central portion of the holder 26 receiving a distal end of the condenser section 241 of the heat pipe 24 therein. Two through holes 262 are provided through which the electric wires 115 extend, respectively. The frame 23 and the holder 26 cooperatively define a space receiving the heat pipe 24, the heat sink 25 and the mounting seat 22 therein.

The electrical section 30 provides drive power, control circuit and power management for the light source 11. The electrical section 30 includes a cylindrical enclosure 33, a cover 34 at a top end of the enclosure 33, a power source 32 such as a battery unit, at a bottom end of the enclosure 33 and a circuit board 31 interconnected between the power source 32 and the heat dissipation section 20. The power source 32 provides an electrode 321 on a bottom end thereof. The circuit board 31 electrically connects with the light source 11 via the electric wires 115, and has a pin electrically contacting the electrode 321 of the power source 32, whereby the light source 11 receives power from the power source 32 via the circuit board 31. The cover 34 includes an elastic member 341 located at a bottom side of the cover 34 and a switch 342 located at a top side of the cover 34. The elastic member 341 interconnects the top end of the enclosure 33 with the cover 34 and is compressed when the enclosure 33 and the cover 34 meet, such that the electrode 321 of the power source 32 firmly contacts the pin of the circuit board 31 due to an elastic force of the elastic member 341. The switch 342 controls the on-off state of the LED illuminating device 100.

In the disclosed LED illumination device 100, heat pipe technology is utilized to effectively remove the heat generated by the emitter 111. During operation, heat generated by the light source 11 is transferred to the mounting seat 22. The heat received by the mounting seat 22 is absorbed by the evaporation section 242 of the heat pipe 24, and transferred to the heat sink 25 via the condenser section 241 of the heat pipe 24. Air in the heat dissipation section 20, i.e., in spaces formed between each two neighboring fins 250, is heated by the heat of the light source 11 transferred to the heat sink 25 and rises via the air venting holes 251 to a top side of the heat sink 25. The heated, rising air escapes to the ambient atmosphere, with cooling air from the ambient atmosphere filling the recently voided spaces between each two neighboring fins 250. Natural air convection circulates airflow through the heat dissipation section 20, dissipating the heat from the light source 11.

FIGS. 6-9 illustrate a light engine 41 of the LED illuminating device 100 according to a second embodiment. In the present embodiment, the light engine 41 includes a U-shaped heat pipe 44, a heat sink 45 including a plurality of waved fins 450 and a saddle-shaped mounting seat 42. The heat pipe 44 includes an evaporation section 442 and two condensation sections 441 extending upwardly and perpendicular to two opposite ends of the evaporation section 442, respectively. The condensation sections 441 are received in the heat sink 25 from bottom to top, with a free end of each of the condensation section 441 extending out of the heat sink 25. The evaporation section 442 is generally straight and flat, and mounted in the mounting seat 42.

Figure 6:
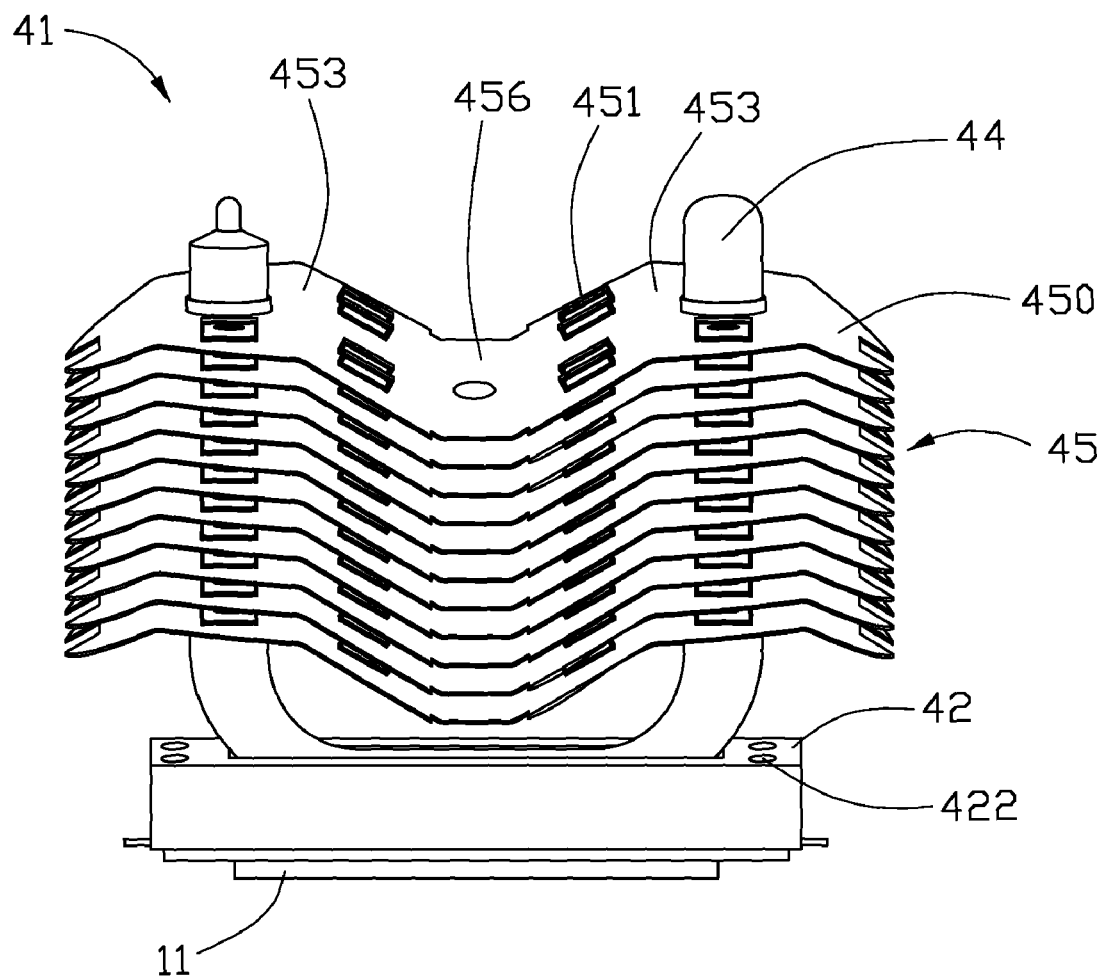
FIG. 6 is an assembled, isometric view of a light engine in accordance with a second embodiment.
Figure 7:
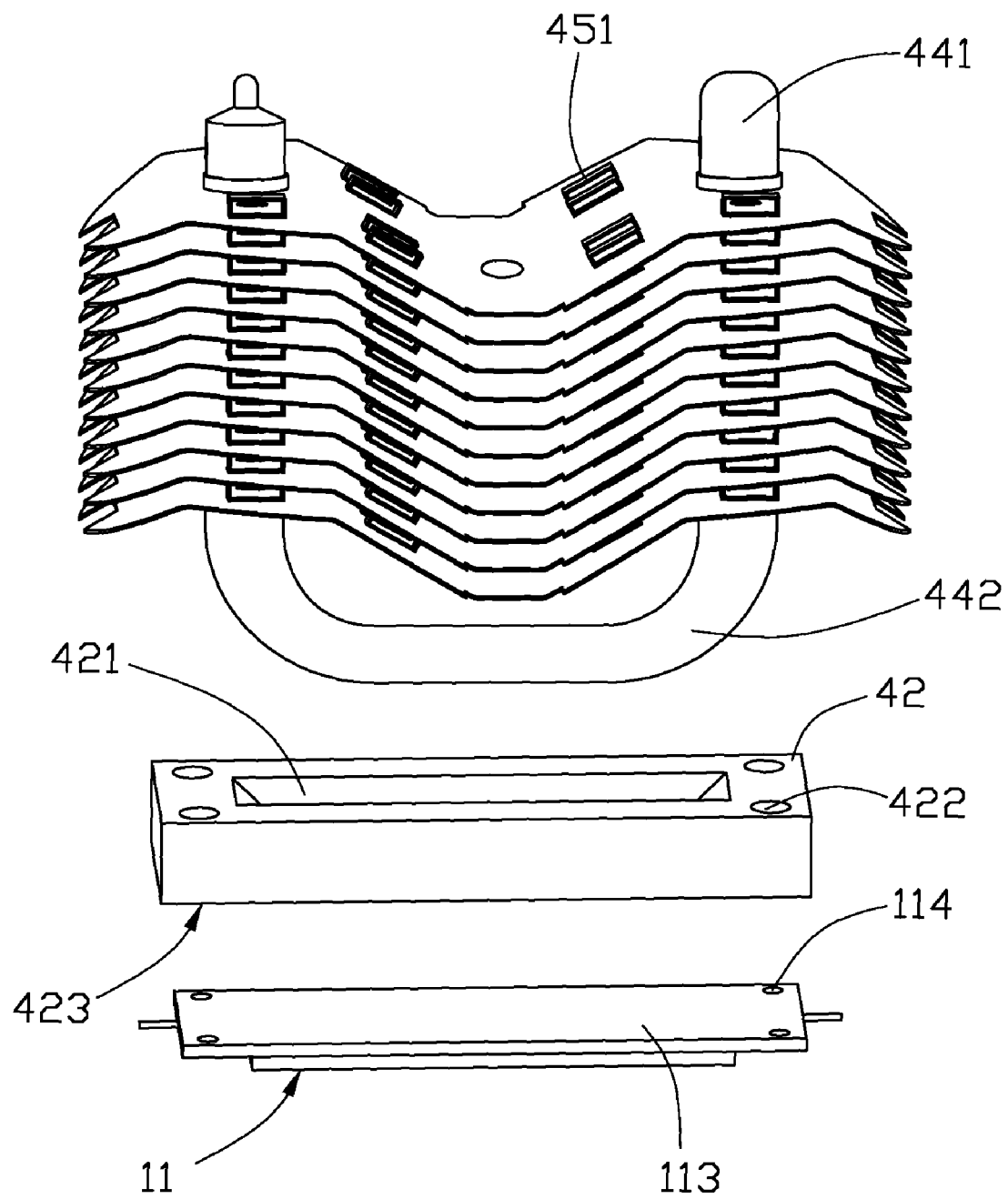
FIG. 7 is an exploded view of the light engine of FIG. 6.
Figure 8:
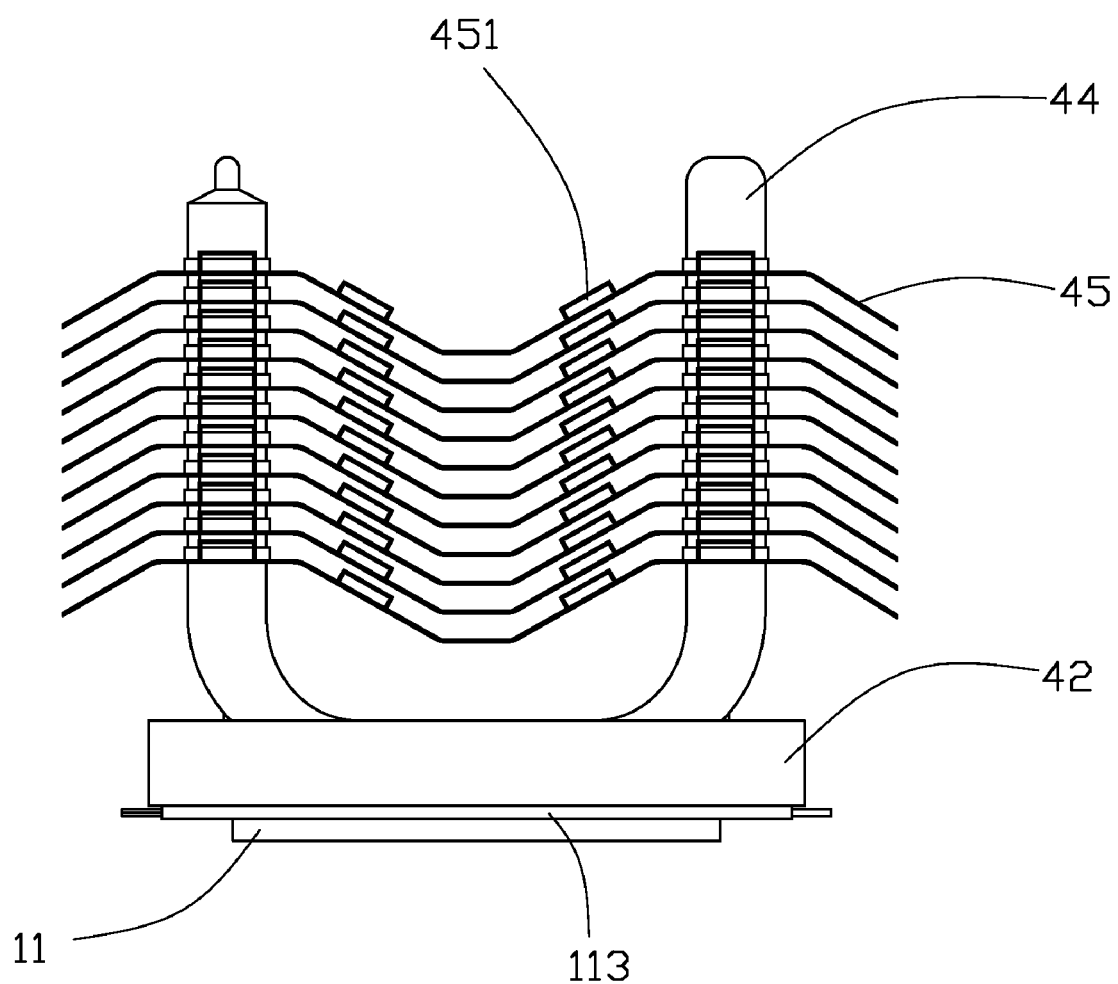
FIG. 8 is a front view of the light engine of FIG. 6.

The mounting seat 42 is highly heat conductive metal, such as copper or copper alloy. Referring to FIGS. 6 and 7, the mounting seat 42 defines a rectangular groove 421 at a top side thereof. The groove 421 receives the evaporation section 442 of the heat pipe 42 therein, with an outer surface of the evaporation section 442 intimately contacting an inner surface of the mounting seat 42 surrounding the groove 421. A bottom surface 423 of the mounting seat 42 intimately contacts the substrate 113 of the light source 11. The mounting seat 42 defines a plurality of threaded holes 422 corresponding to the threaded holes 114 of the substrate 113. Fasteners pass through the threaded holes 114, 422 to thereby mount the light source 11 on the mounting seat 42. Air between the fins 450, heated by the heat of the light source 11 transferred thereto through the heat pipes 44, rises through the air venting holes 451 to a top side of the heat sink 45, and then escapes to the ambient atmosphere.

Figure 9:
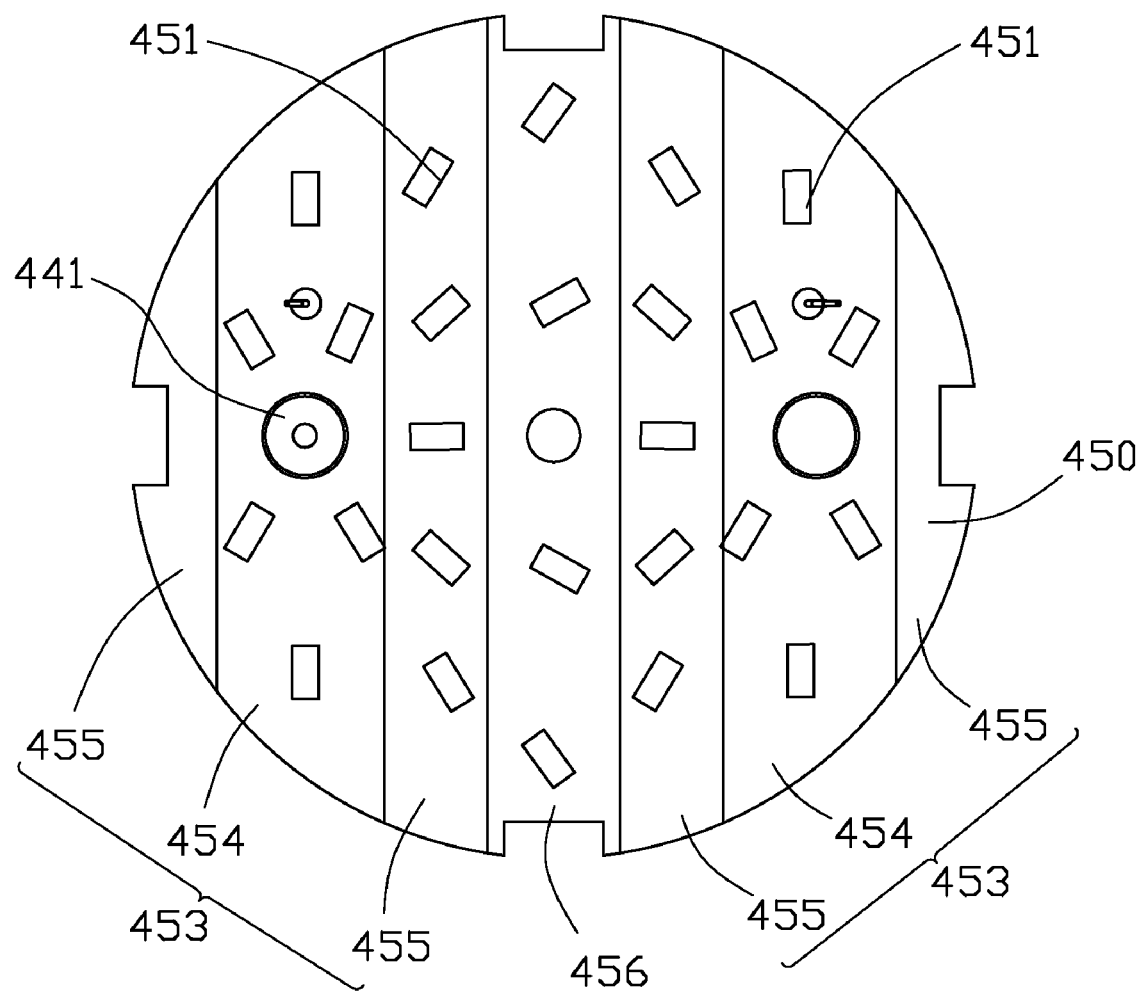
FIG. 9 is a top plan view of the light engine of FIG. 6.

Referring to FIG. 9, each fin 450 of the heat sink 45 includes two umbrella-shaped portions 453 arranged symmetrically with a connecting portion 456 communicating therebetween. Each of the umbrella-shaped portions 453 includes a main body 454 perpendicular to the condenser section 441 of the heat pipe 44, and two flanges 455 angling downward from two opposite edges of the main body 454 towards the light source 11, respectively. A plurality of air venting holes 451 are defined in the main body 454 and the flanges 455 of each fin 450. Each of the air venting holes 451 communicates with two opposite sides of a corresponding fin 450 which defines the air venting holes 451.

It is to be understood, however, that even though numerous characteristics and advantages of the present disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED illuminating device, comprising:
an optical section at a bottom end of the LED illumination device, the optical section comprising a light source and a light output housing around the light source;
an electrical section at a top end of the LED illumination device, the electrical section electrically connecting with the light source; and
a heat dissipation section between the optical section and the electrical section comprising:
a mounting seat to which the light source is attached;
a heat pipe comprising an evaporation section and at least one condenser section, the evaporation section fixed on the mounting seat and thermally connected with the light source; and
a heat sink in which the at least one condenser section of the heat pipe is received, the heat sink comprising a plurality of fins each comprising at least one umbrella-shaped portion, each of the umbrella-shaped portions comprising a main body perpendicular to the at least one condenser section of the heat pipe and two flanges angling downward from two opposite edges of the main body towards the light source, a plurality of air venting holes being defined in the main body and the flanges of each fin, whereby air between each two neighboring fins is heated and rises via the air venting holes to a top side of the heat sink during operation of the LED illuminating device.

2. The LED illuminating device of claim 1, wherein the condenser section extends through the main body of the umbrella-shaped portion from the bottom to the top of the heat sink.

3. The LED illuminating device of claim 2, wherein the mounting seat comprises a bottom wall and an annular sidewall extending upwardly from the bottom wall, the heat pipe being straight, and the evaporation section being enclosed by the sidewall and having a planar end surface contacting the bottom wall.

4. The LED illuminating device of claim 1, wherein each of the fins comprises two umbrella-shaped portions, each of the fins further comprising a connecting portion between the two umbrella-shaped portions, and the umbrella-shaped portions of each fin are symmetrical with respect to the connecting portion.

5. The LED illuminating device of claim 4, wherein the heat pipe comprises two condenser sections and is U-shaped, and wherein the mounting seat is disposed on the evaporation section of the heat pipe, one of the condenser sections extends through the main body of each umbrella-shaped portion located on one side of the connecting portion from the bottom to the top of the heat sink, the other condenser section extending through the main body of each umbrella-shaped portion located on an opposite side of the connecting portion.

6. The LED illuminating device of claim 5, wherein the mounting seat is saddle-shaped and defines a groove at a top side receiving the evaporation section of the heat pipe therein, and the light source is attached to a bottom surface of the mounting seat.

7. The LED illuminating device of claim 1, wherein the heat dissipation section further comprises a frame supporting the heat sink and a holder mechanically connecting the heat dissipation section with the electrical section, the frame comprising a base and a plurality of arms extending backward, with the frame and the base cooperatively defining a space receiving the heat pipe, the heat sink and the mounting seat therein.

8. The LED illuminating device of claim 7, wherein the heat sink defines a plurality of latching grooves at an outer circumferential surface thereof, and the arms are received in the latching grooves, respectively.

9. The LED illuminating device of claim 7, wherein the heat sink defines a plurality of through holes therein, the holder defines a plurality of through holes therein, and a plurality of electric wires extend from the light source through the through holes of the heat sink and the holder to electrically connect the light source with the electrical section.

10. The LED illuminating device of claim 1, wherein the electrical section comprises an enclosure, a power source providing an electrode at a bottom end of the enclosure and a circuit board connecting the enclosure with the heat dissipation section, the circuit board electrically connecting the light source via electric wires and the power source via the electrode, respectively.

11. The LED illuminating device of claim 10, wherein the electrical section further comprises a cover at a top end of the enclosure and an elastic member between the enclosure and the cover, the elastic member being compressed when the enclosure and the cover fixedly connect, such that the electrode of the power source firmly contacts a pin of the circuit board due to resilient force of the elastic member.

12. The LED illuminating device of claim 10, wherein the electrical section further comprises a switch controlling the on-off state of the LED illuminating device.

13. A light engine of an LED illuminating device, comprising:
a light source;
a mounting seat to which the light source is attached;
a heat pipe comprising an evaporation section and at least one condenser section, the evaporation section fixed on the mounting seat and thermally connected with the light source; and
a heat sink in which the at least one condenser section of the heat pipe is received, the heat sink comprising a plurality of fins each comprising at least one umbrella-shaped portion, the at least one umbrella-shaped portion comprising a main body perpendicular to the at least one condenser section of the heat pipe and two flanges angling downward from two opposite edges of the main body towards the light source, a plurality of air venting holes being defined in the main body and the flanges of the at least one umbrella-shaped portion of each fin, whereby air between each two neighboring fins is heated and rises via the air venting holes to a top side of the heat sink during operation of the light engine.

14. The light engine of the LED illuminating device of claim 13, wherein the condenser section extends through the main body of the at least one umbrella-shaped portion from the bottom to the top of the heat sink, the evaporation section having a planar end surface contacting the mounting seat.

15. The light engine of the LED illuminating device of claim 13, wherein each fin comprises two umbrella-shaped portions, the umbrella-shaped portions being symmetrical with respective to a centre of the fin, and wherein the heat pipe comprises two condenser sections, one extending through the main body of each umbrella-shaped portion located on one side of each of the fins from the bottom to the top of the heat sink, and the other condenser section extending through the main body of each umbrella-shaped portion located on an opposite side of each of the fins from the bottom to the top of the heat sink.

* * * * *